(12) United States Patent
Ranganathan et al.

(10) Patent No.: US 9,599,666 B2
(45) Date of Patent: Mar. 21, 2017

(54) MINIMUM VOLTAGE AND MAXIMUM PERFORMANCE MAPPING USING LASER-ASSISTED TECHNIQUES

(71) Applicant: QUALCOMM Incorporated, San Diego, CA (US)

(72) Inventors: Lavakumar Ranganathan, San Diego, CA (US); Martin Villafana, Bonita, CA (US); Lesly Zaren Venturina Endrinal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 88 days.

(21) Appl. No.: 14/525,539

(22) Filed: Oct. 28, 2014

(65) Prior Publication Data

US 2016/0116531 A1  Apr. 28, 2016

(51) Int. Cl.
*G01R 31/308* (2006.01)
*G01R 31/311* (2006.01)
*G01R 31/28* (2006.01)

(52) U.S. Cl.
CPC ........ *G01R 31/311* (2013.01); *G01R 31/2834* (2013.01); *G01R 31/2837* (2013.01)

(58) Field of Classification Search
CPC .... G01R 1/071; G01R 31/26; G01R 31/2601; G01R 31/2851; G01R 31/08; G01R 31/311
See application file for complete search history.

(56) References Cited

U.S. PATENT DOCUMENTS

| | | | |
|---|---|---|---|
| 5,444,260 A * | 8/1995 | Kazmerski | B82B 3/00 250/307 |
| 5,570,011 A * | 10/1996 | Henley | G01R 31/308 324/73.1 |
| 6,859,031 B2 | 2/2005 | Pakdaman et al. | |
| 6,967,491 B2 | 11/2005 | Perdu et al. | |
| 7,795,887 B2 | 9/2010 | Glazer et al. | |
| 7,872,489 B2 | 1/2011 | Dickson et al. | |
| 2009/0147255 A1 | 6/2009 | Erington et al. | |
| 2011/0164808 A1* | 7/2011 | Laisne | H01L 21/6836 382/149 |

* cited by examiner

*Primary Examiner* — Tung X Nguyen
(74) *Attorney, Agent, or Firm* — Loza & Loza, LLP (57) ABSTRACT

A method and apparatus for mapping an electronic device. The electronic device is loaded into a test fixture, which may be an automated test equipment (ATE). A laser beam is stepped across locations of interest. At each location of interest a minimum voltage and/or maximum frequency are computed. A contour map of the changes in minimum voltage and maximum frequency across a field of view of the electronic device is generated. Additional embodiments provide signaling a laser scan module during the rising edge of a synchronization pulse to indicate that minimum voltage (Vmin) and maximum frequency (Fmax) specification search data is provided to a laser voltage probe. A Vmin/Fmax module compares the specification search data with the data read from the laser voltage probe and computes a parameter shift value. The laser beam is moved to another location when the falling edge of the synchronization pulse occurs.

9 Claims, 8 Drawing Sheets

MINIMUM VOLTAGE AND MAXIMUM PERFORMANCE MAPPING USING LASER-ASSISTED TECHNIQUES

FIELD

The present disclosure relates generally to electrical fault isolation, and more specifically, to an electrical fault isolation technique which enables minimum voltage and maximum frequency characterization and contour mapping using a laser voltage probe or dynamic laser stimulus.

BACKGROUND

Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipment, and similar terms. Other electronic devices such as tablet computers and gaming devices incorporate chipsets to provide a wide variety of functions. These devices rely on increasingly complex chipsets that require complex and thorough testing before installation into an end device.

As electronic devices have grown in use and popularity, they have also increased in complexity. Most electronic devices rely on one or more chipsets to provide increasing levels of functionality. Users rely heavily on these devices and it is critical that the devices perform as promised. This requires that the chipsets incorporated into the devices be thoroughly tested and evaluated for various defects before incorporation into an end product. During testing, some devices may exhibit performance limitations (including minimum operating voltage and maximum operating frequency). These are called "soft failures". Devices exhibiting "soft failures" may undergo failure analysis in order to determine the root cause of the marginal failures. Electrical fault isolation is a fundamental failure analysis protocol which allows the failure to be narrowed down to a few failing transistors or logic cells.

Electrical fault isolation in a chipset typically involves testing an integrated circuit (IC) die. One of many fault isolation techniques is Laser Voltage Probing (LVP), which allows waveforms to be measured directly from the backside of the chip. This technique uses a laser source of a specific wavelength and aims it on a transistor source or drain region. The incoming laser source gets reflected and modulated by the switching of the active transistor, thus allowing either a frequency map of the chip or a plot of the waveform to be created.

However, in the case of soft defect failures, the laser voltage probing may inadvertently stimulate the transistor being probed and thus may cause a false pass of the circuit being tested. This may cause inaccuracy with respect to the waveforms. Hence, instead of laser voltage probing, a laser stimulation technique which provides a contour map of the minimum operating voltage (Vmin) and maximum operating frequency (Fmax) has been needed and has been developed. As part of the testing, a LVP is used to stimulate the semiconductor circuit while measuring the parameters such as Vmin and Fmax at both laser and no laser conditions. The improvement in Vmin and Fmax is recorded and plotted as a contour map across the field of view. At the present time, this process is performed manually and is time consuming and inefficient.

Thus, there is a need in the art for a method and apparatus to automate the laser positioning and contour mapping for use in diagnosing marginal voltage and frequency failures in chipsets, and aid in localizing any defects identified.

SUMMARY

Embodiments contained in the disclosure provide a method of mapping an electronic device. The electronic device is loaded into a test fixture. This test fixture may be an automated test equipment (ATE). A laser beam is then stepped across locations of interest on the electronic device. At each location of interest a minimum operating voltage and/or maximum operating frequency is measured via the Automatic Test Equipment (ATE). A contour map of the changes in minimum voltage and maximum frequency across a field of view of the electronic device is then generated. The stepping of the laser beam across the locations of interest may further comprise: signaling a laser scan module during the rising edge of a synchronization pulse. This signaling indicates that minimum voltage (Vmin) and maximum frequency (Fmax) specification search data is available. The data is then sent from the test fixture to a laser voltage probe or dynamic laser stimulation tool. A Vmin/Fmax contour mapping module logs the specification search data coming from the ATE. The Vmin/Fmax mapping module then compares the specification search data with the initial Vmin/Fmax data read when the laser stimulus is off and computes a parameter shift value. The laser beam is then moved to another location of interest when the falling edge of the synchronization pulse occurs.

A further embodiment provides an apparatus for mapping an electronic device. The apparatus comprises: a test fixture, a silicon immersion lens, a laser scan module having a laser source and a laser controller; a minimum voltage (Vmin) and maximum frequency (Fmax) mapping module, and a photo detector. The Vmin/Fmax mapping module may incorporate a processor.

A still further embodiment provides an apparatus for mapping an electronic device. The device comprises: means for loading an electronic device into a test fixture; means for stepping a laser beam across locations of interest on the electronic device; means for computing a minimum voltage at each location of interest; and means for generating a contour map of changes in minimum voltage and maximum frequency across a field of view of the electronic device.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuring description, the accompanying drawings and the appended claims.

Many electronic devices today incorporate chipsets to provide functionality. These chipsets may be composed of flip-chips. A flip-chip is also known as a controlled collapse chip connection (C4). A flip-chip provides a method of interconnecting semiconductor devices, such as IC chips and microelectromechanical systems (MEMS), to external circuitry with solder bumps that have been deposited onto the chip pads. The solder bumps are deposited on the chip pads on the topside of the wafer during the final wafer processing step. In order to mount the chip to external circuitry (a circuit board or another chip or wafer), it is flipped over so that its topside faces down, and aligned so that its pads align with matching pads on the external circuit. The solder is then reflowed to complete the interconnect.

Flip-chips may be tested using a laser voltage probe. The laser voltage probe is a laser-based voltage and timing waveform acquisition system that is used to perform failure analysis on flip-chip integrated circuits. The device to be analyzed is de-encapsulated, which means that the case or cover of the device is removed to expose the internal circuitry for analysis. More specifically, de-encapsulation exposes the silicon surface of the flip-chip. The silicon substrate is then thinned mechanically using a backside mechanical thinning tool. The thinned device is then mounted on a movable stage and connected to an electrical stimulus source. Signal measurements are performed through the backside of the device after substrate thinning has been performed. The device being probed by the laser is electrically stimulated using a repeating test pattern, with a trigger pulse provided to the laser voltage probe as a reference.

The laser voltage probe instrument measures voltage waveform signals in the device diffusion regions. Device imaging is accomplished through the use of a laser scanning microscope. (LSM). The laser voltage probe may use dual infra-red (IR) lasers to perform both device imaging and waveform acquisition. One laser is used to acquire images or waveforms on the device, while the second laser provides a reference which may be used to subtract unwanted noise from the signal data being acquired. On an electrically active device, the instrument monitors the changes in the phase of the electromagnetic field surrounding a signal being applied to a junction.

The instrument obtains voltage waveform and timing information by monitoring the interaction of laser light with the changes in the electric field across a p-n junction. As the laser reaches the silicon surface, a certain amount of that light is reflected back. The amount of reflected laser light from the junction is sampled at various points in time. The changing electromagnetic field at the junction affects the amount of laser light that is reflected back. By plotting the variations in reflected light versus time, it is possible to construct a timing waveform of the signal at the junction. As the test pattern continues to loop, additional measurements are acquired and averaged into the previous measurements. Over a period of time, this averaging of measurements produces a more refined waveform. The end result is a waveform that is representative of the electrical signal present at the junction.

Laser voltage imaging and probing is a laser based failure analysis technique that allows mapping of frequencies of interest within a field of view, known as laser voltage imaging (LVI). The technique also allows direct measurement of internal signals directly from the transistor p-n junctions using a 1340 nm laser voltage probe (LVP). This technique is used to analyze many digital failures including scan integrity, logic, memory, phase locked loop, functional fails, and others. The LVI/LVP tools uses a 1340 nm laser that is aimed at the p-n junction. This laser signal is reflected and then detected using a sensitive photo detector. The reflected laser signal is modulated by the switching of the p-n junction, and thus enables measurement of waveforms or mapping of signals. In some situations the 1340 nm laser caused thermal effect with the p-n junctions of some laser sensitive transistors or other components. These thermal effects appeared as a false pass.

Embodiments described herein provide a method for performance mapping minimum voltage and maximum frequency performance using laser assisted techniques. In embodiments, the laser is used to stimulate transistors within a failing cell and also to measure the maximum frequency and minimum passing voltage for the cell under test. The method involves moving the laser over strategic locations in an organized pattern and demonstrating the performance improvement when compared against a baseline voltage for the non-laser stimulated state. The embodiments are designed to provide a contour mapping feature for changes in minimum voltage and changes in maximum frequency. The embodiments described herein may be used with all laser stimulation tools such as LVPs and dynamic laser stimulation (DLS) tools. In addition, the methodology and automation may be used to topographically map analog and RF test parameters.

Figure 1:
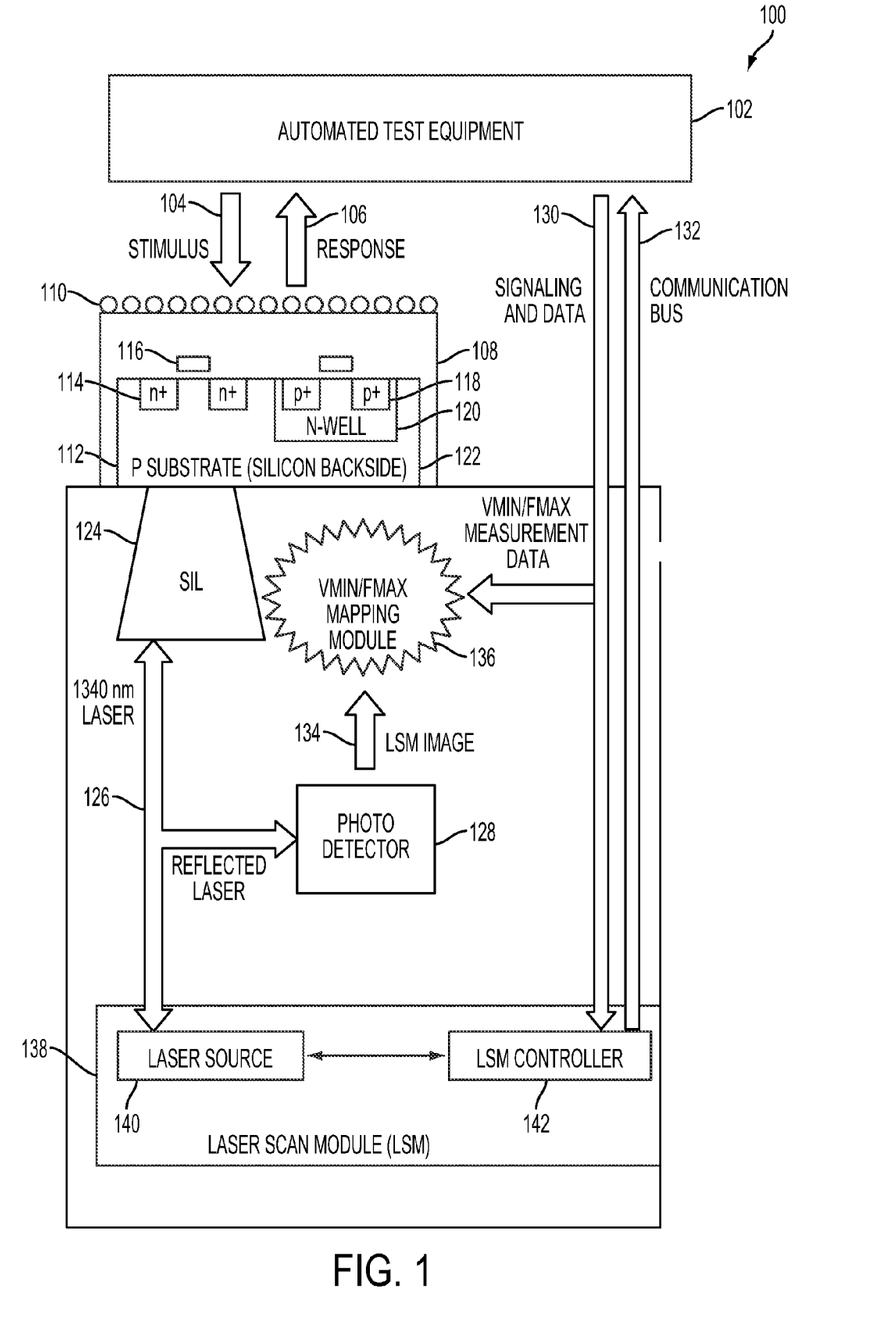
FIG. 1 depicts an apparatus for minimum voltage and maximum performance mapping using laser assisted techniques, in accordance with certain embodiments of the disclosure.

FIG. 1 illustrates a test set up and signal flow of a method and apparatus for performance mapping minimum voltage and maximum frequency in accordance with embodiments described herein. The assembly, 100 is comprised of the elements and signals described below. Automated test equipment 102 may include processors running test programs. Automated test equipment 102 may provide specific test details in test programs that govern the execution of selected test routines. These test routines are selected as part of a test and validation scheme devised for the device or chip in question. Automated test equipment is often used to test a wide range of behaviors and parameters of electronic chips and devices. These test programs may also control laser device mapping and testing.

Automated test equipment 102 begins operation by sending a stimulus 104 to a device under test (DUT) 108. DUT includes chip or die electrical contacts 110 which receive stimulus 104 from the automated test equipment 102. DUT 108 may be composed of P-substrate 112 that may include N doping or material 114 embedded in P-substrate 112. On top of the substrate may be found circuit traces 116. Other portions of DUT 108 may have P-substrate regions 118 embedded within a region of N-substrate material known as an N-well 120. Around the P and N substrates may be found the device substrate or wafer material 122. All of these components interact electrically when the stimulus signal 104 is received from automated test equipment 102 and act to produce response signal 106, which is sent back to automated test equipment 102.

A silicon immersion lens (SIL) 124 is applied, after preparation, to the backside of the DUT 108. The preparation of DUT 108 may require removal of any material on the back of the device. The SIL 124 directs laser light 126 onto a target test area of DUT 108. While FIG. 1 shows a 1340 nm laser light being used, other frequencies may be used for other testing purposes. Other laser values may be used without departing from the scope of the embodiments described herein. FIG. 1 also shows a portion of the laser light 126 reflected onto a photo detector 128.

Laser light 126 is produced by laser source 140. Laser source 140 is contained within laser scan module (LSM) 138. Laser source 140 is in communication with LSM controller 142, which provides commands to laser source. LSM controller 142 receives signaling data 130 from the automated test equipment 102. After processing the signaling and data information 130 LSM controller 142 may send reply data or other information to the automated test equipment 102 over communication bus 132.

Photo detector 128 detects the reflected portion of laser light 126 and creates an LSM image 134. The LSM image 134 is sent to the minimum voltage/maximum frequency mapping module 124. Minimum voltage/maximum frequency mapping module 134 produces the performance map of the circuit or device being analyzed.

In order to produce the performance map the minimum voltage/maximum frequency mapping module makes use of the secondary effects of laser voltage probing to look for laser sensitive sites or transistors in the LSM image 134. In operation, instead of measuring signals using the laser voltage probe, laser beam 126 is used to stimulate transistors within a failing cell while collecting minimum passing voltage (Vmin) and/or maximum passing frequency (Fmax) data for plotting on an adaptive and flexible diagram of the device.

By parking the laser at one location at a time, localized thermal stimulation (using a 1340 nm laser, to give one example) or photoconduction (using a 1064 nm laser to give a further example) occurs. This localized stimulation alters the electrical pass/fail behavior on laser sensitive spots. This results in a difference, or delta (Δ) in Vmin or Fmax, as compared to the values without laser stimulation. These delta values are notes and mapped across the layout of the component being tested and aid in determining the most laser sensitive site, which may be connected to a failure location.

$$\Delta V\text{min} = V\text{min}_{No\ Laser} - V\text{min}_{Laser}$$

$$\Delta F\text{max} = F\text{max}_{No\ Laser} - F\text{max}_{Laser}$$

While the above formulas demonstrate the calculations for Vmin and Fmax, it is also possible to use the method and apparatus to examine other properties of interest, such as dB, and the embodiments described herein are not to be limited solely to the values and properties provided in the examples.

The Vmin/Fmax mapping module 134 enables the laser voltage probe to automatically step through various locations within the field of view to thermally stimulate p-n junctions or other components deemed of interest. In addition, Vmin/Fmax mapping module 134 acquires and processes the automated test equipment 102 Vmin and/or Fmax data at each location where laser beam 126 was stopped to thermally stimulate components of interest. Once the data has been collected for the areas of interest, a contour map of ΔVmin and ΔFmax may be created.

Figure 2:
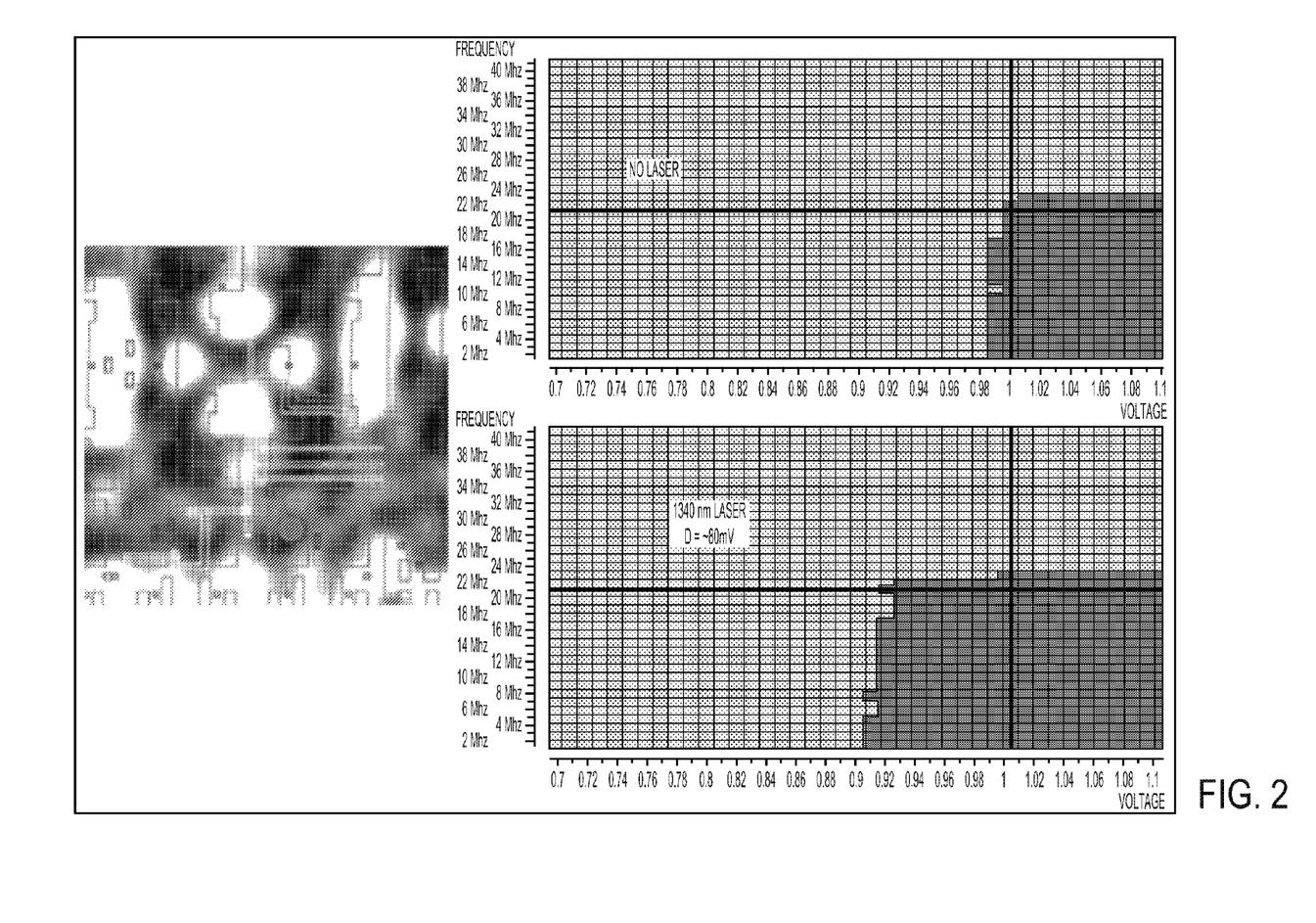
FIG. 2 illustrates a shmoo plot containing pass/fail values at various voltage and frequency settings, in accordance with embodiments of the disclosure.

FIG. 2 illustrates a shmoo plot containing pass/fail values at various voltage and frequency settings. The pass/fail boundary of this shmoo plot translates to Vmin and Fmax measurement values. The top shmoo diagram depicts the electrical pass/fail behavior with no laser stimulation, while the bottom shmoo diagram depicts the pass/fail behavior when a 1340 nm laser, to give one example, stimulates a certain transistor location. The difference or delta between the two values is the parameter shift, which is then plotted in a contour map. A Shmoo plot is a graphical display of the response of a component or system varying over a range of conditions and inputs. Shmoo plots or diagrams may be used to represent the results of the testing of complex electronic systems such as computers or integrated circuits including dynamic random access memories (DRAM), application specific integrated circuits (ASIC), or microprocessors. The plot usually shows that range of conditions in which the DUT operates.

The left side of FIG. 2 illustrates the traces and outlines of the components on the device. The shading indicates the appearance of the circuit when illuminated by the laser voltage probe.

When testing semiconductor memories, voltages, temperatures, and refresh rates may be varied over specified ranges and temperatures where the device will operate. Plotted on independent axes (voltage, temperature, refresh rates), the range of working values encloses a three-dimensional, typical oddly shaped volume. Two-dimensional plots may also be created. One variable is plotted on one axis against another variable. The two-dimensional plot also allows visual observation of the parameters tested. In FIG. 2, the upper right diagram shows the pass/fail of the individual circuit elements of the die when there is no laser stimulation. The lower right diagram shows the same circuit elements with thermal stimulation from a 1340 nm laser.

Figure 3:
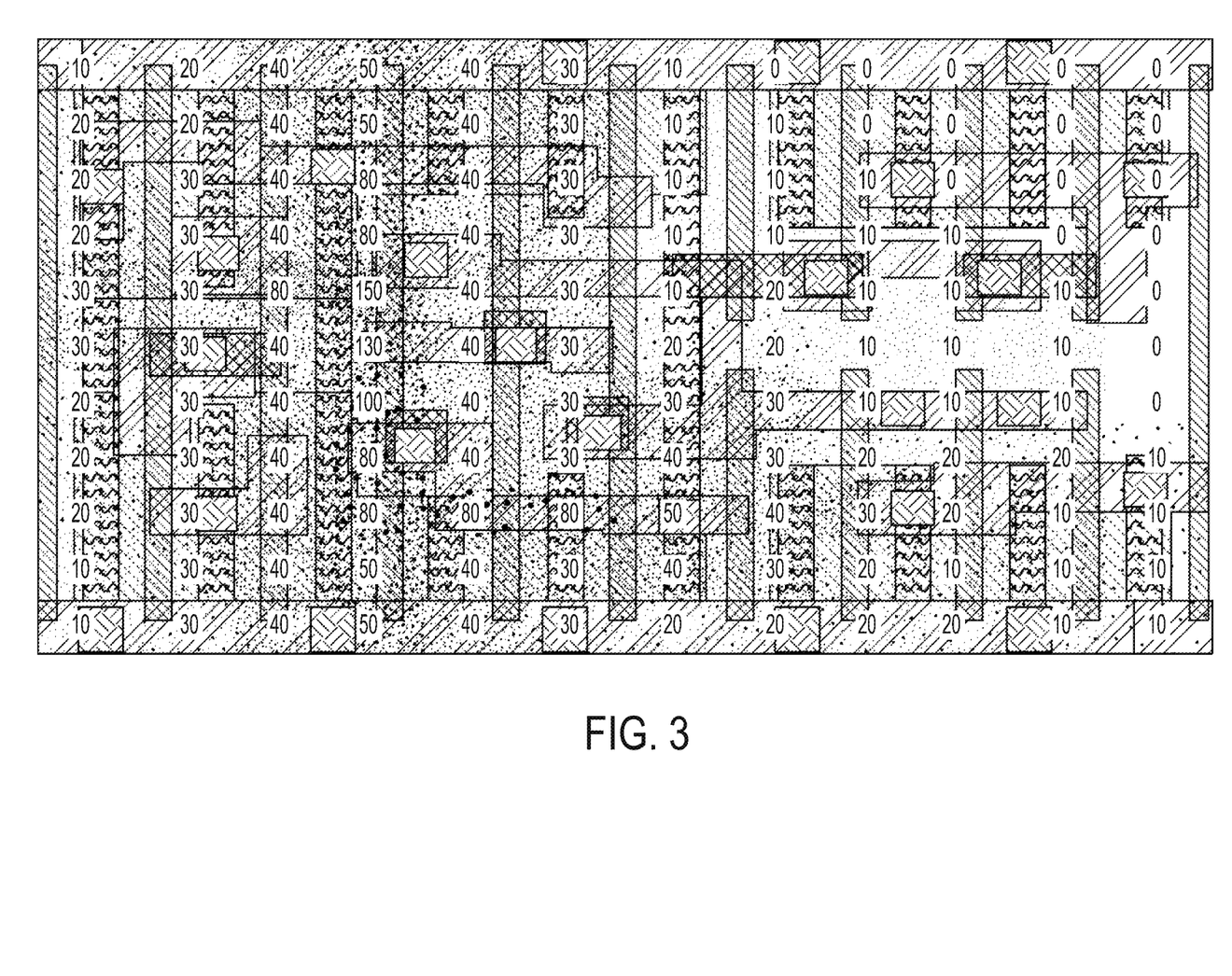
FIG. 3 depicts a change in minimum operating voltage (Vmin contour map) for a failing scan cell bit when mapped, according to an embodiment of the disclosure.

FIG. 3 depicts the delta Vmin mapping on a failing scan cell bit. The failing scan cell bit is indicated by the dashed lines. The laser voltage probe has stimulated the area within the dashed lines and this mapping is depicted in FIG. 3.

Figure 4:
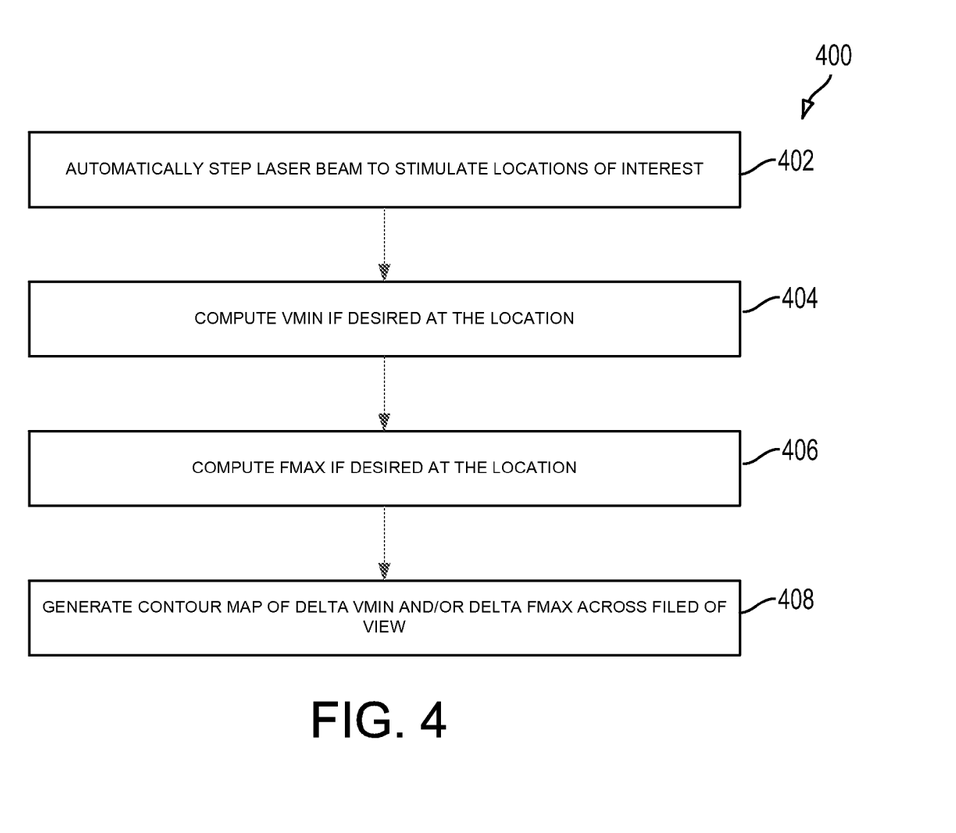
FIG. 4 is a flow diagram of a method of performance mapping minimum voltage and maximum frequency, according to an embodiment of the disclosure.

FIG. 4 is a flow diagram of a method for Vmin and Fmax performance mapping using a laser probe. The method 400 begins at step 402. In step 402 the laser beam of a laser voltage probe is automatically stepped to various predetermined locations on a device that are deemed of interest. For each location of interest, the automated test equipment computes Vmin, in step 404. Also at each predetermined location, Fmax is computed in step 406. Fmax or Vmin may be computed at each location, as desired. Once Vmin and Fmax have been computed, or the selected value has been computed, a contour map or Shmoo diagram of ΔVmin and/or ΔFmax is generated for the field of view. The method assists in characterizing devices and analyzing their performance.

Figure 5:
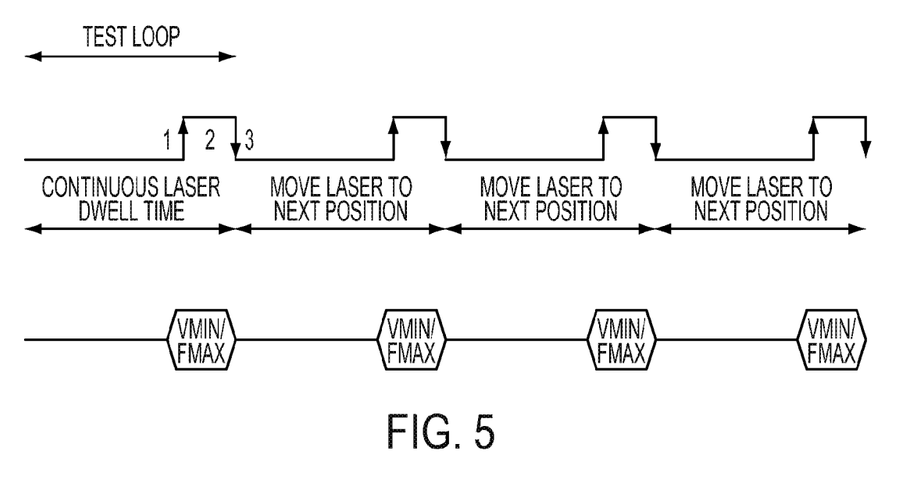
FIG. 5 illustrates flow in a signaling method according to an embodiment of the disclosure.

FIG. 5 illustrates a signaling method that is used to generate a contour map or Shmoo diagram of a device undergoing testing. Vmin/Fmax data is sent from the automated test equipment to the laser voltage probe system at each tester loop. This embodiment requires sufficient time for the automated test equipment and laser voltage probe to communicate with one another. Before running the laser stimulus of the device being tested, Vmin/Fmax specification search data should be run with no laser stimulus.

FIG. 5 illustrates a signaling and data transfer method during laser stimulation of the DUT. During the rising edge of the synchronization (sync) pulse, the tester signals the laser scan module (LSM) that the Vmin/Fmax specification search data is ready for the test to begin. The Vmin/Fmax information is sent over a communication bus between the automated test equipment and the LSM to the laser voltage probe system. the Vmin/Fmax mapping module logs in this data and uses it together with the initial Vmin/Fmax data with no laser stimulation to generate the parameter shift measurement values, discussed above as delta values. At the falling edge of the sync pulse, the LSM moves the continuous laser to the next position. This process is repeated for each selected position. The tester may simultaneously send the Vmin/Vmax data through the communication bus while the next round of tests proceeds.

Figure 6:
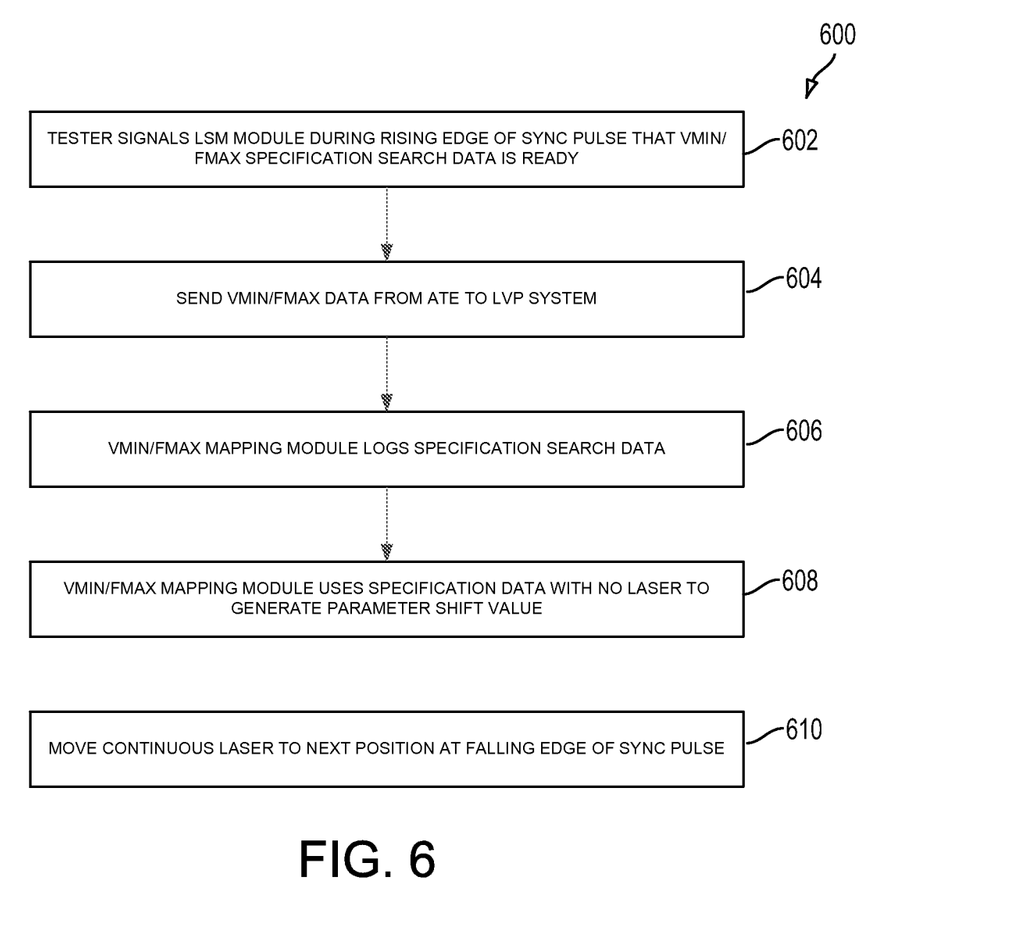
FIG. 6 is a flow diagram of a signaling method according to an embodiment of the disclosure.

FIG. 6 is a flow diagram of a signaling and data transfer method of the signal flow depicted in FIG. 5. The method, 600 begins in step 602 when the tester signals the LSM module during the rising edge of the sync pulse that Vmin/Fmax specification data is ready. In step 604 the Vmin/Fmax data is sent from the tester (automated test equipment, ATE) to the LVP system. Next, in step 606, the Vmin/Fmax mapping module logs the specification search data. Once the data has been logged, in step 608 the Vmin/Fmax mapping module uses the specification data and uses it together with the initial Vmin/Fmax data with no laser to generate the parameter shift values. In step 610, at the falling edge of the sync pulse, the LSM moves the continuous laser to the next location. At this point, the method repeats for the new location and continues until all identified locations have been stimulated.

Figure 7:
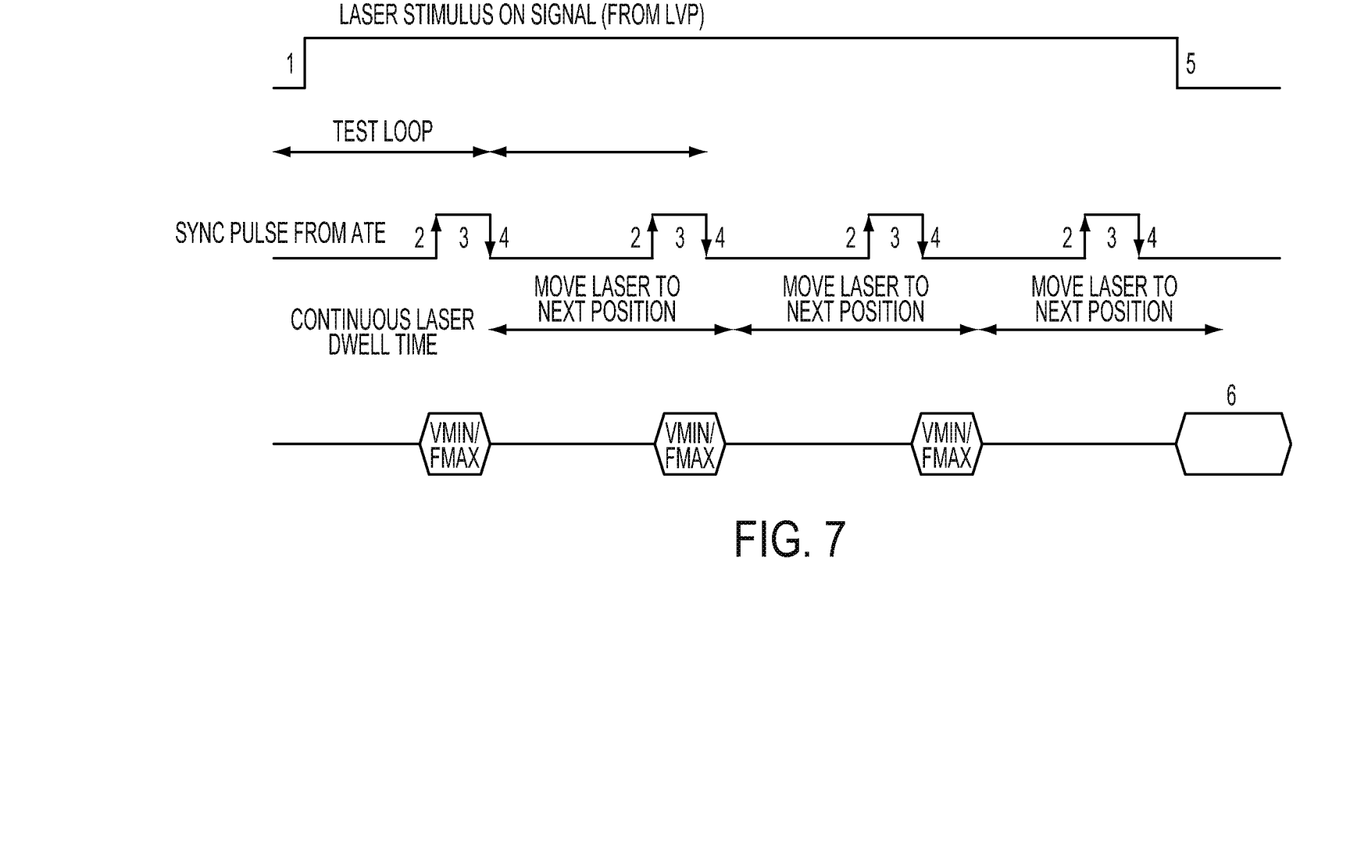
FIG. 7 illustrates a further signaling method according to an additional embodiment of the disclosure.

FIG. 7 illustrates a further embodiment of a signaling and data transfer method that may be used to generate a contour map or Shmoo diagram. This alternative signaling embodiment provides for continuous logging of Vmin/Famx data until the end of all of the laser stimulus activity. Once the scanning has been completed, the LVP sends a signal to the automated test equipment, which then returns the complete Vmin/Fmax search data. In this embodiment, post-processing is done on the Vmin/Fmax module described herein to create the contour map.

As with the previous embodiment, before running a test with a laser stimulus, Vmin/Fmax specification search data should be initially performed with no laser stimulation. FIG. 7 depicts a method of signaling and data transfer during the laser stimulation of the DUT. The method is begun when the laser stimulus signal indicates "HIGH", this means that the laser stimulus is active. This "HIGH" signal indicates to the automated test equipment that logging data should begin. During the rising edge of the synchronization pulse, the tester signal the LSM that the Vmin/Fmax specification search data is ready. This alerts the mapping module that the specification search data is ready for testing. Both the automated test equipment and the LSM log the specification search measurement and x,y location. At the falling edge of the sync pulse, the LSM moves the continuous laser to the next indicated stimulus position. When the laser stimulus signal goes "LOW", this indicates that the laser stimulus has stopped. This signals the automated test equipment to cease logging data. The automated test equipment sends the Vmin/Fmax logged information to the LVP system. The Vmin/Fmax mapping module the uses the logged information to determine the delta Vmin and delta Fmax by subtracting the laser stimulus value from the no laser stimulus value. This information is then used together with the laser scan x,y log to generate a delta Vmin/Fmax contour map which is overlaid on the LSM image.

Figure 8:
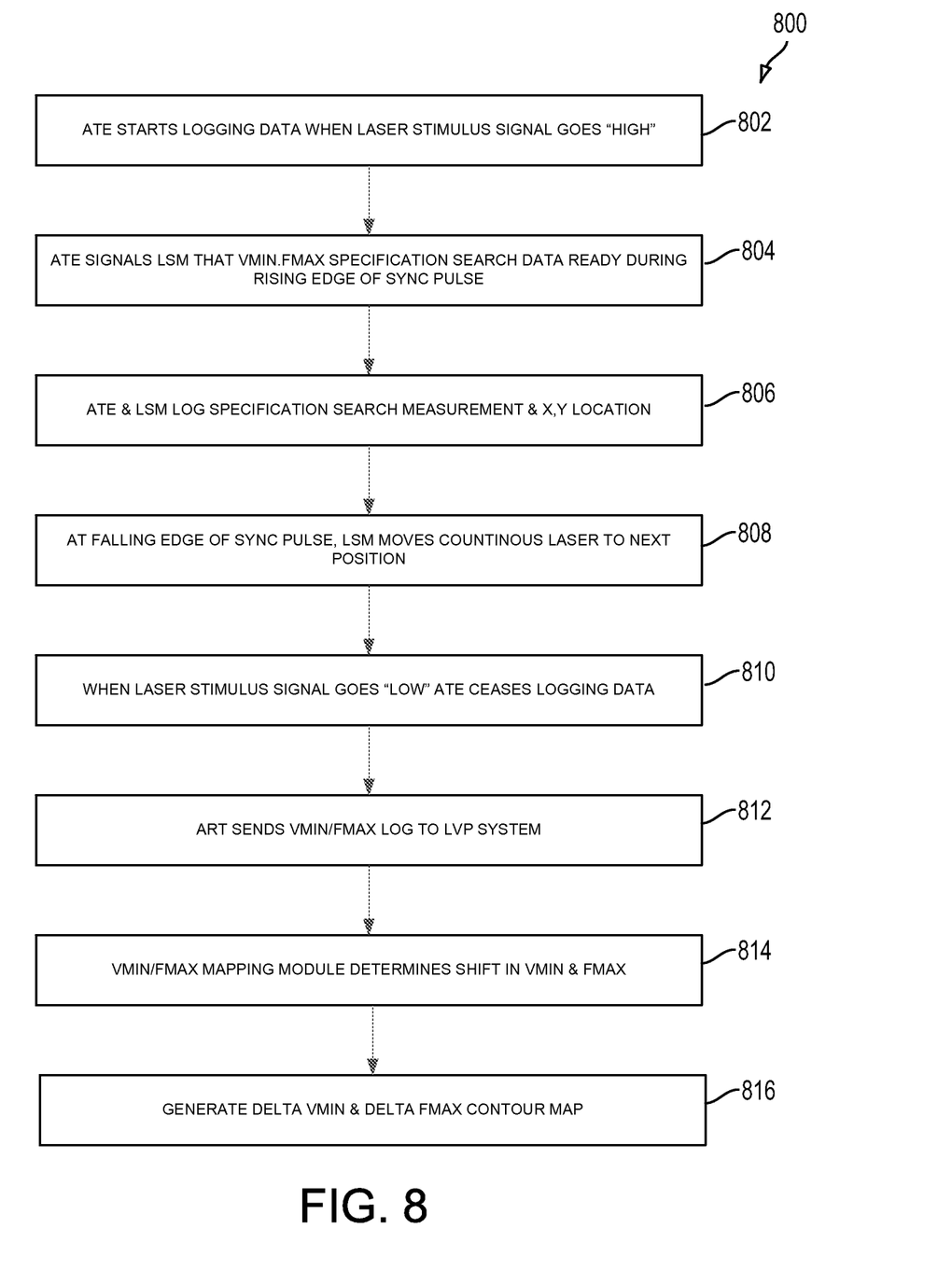
FIG. 8 is a flow diagram of a further signaling method according to an additional embodiment of the disclosure.

FIG. 8 is a flow diagram of an additional embodiment of a signaling method. The method 800, begins when the laser stimulus signal goes "High", indicating that the laser stimulus is on. At this point, the ATE starts logging data. In step 804, during the rising edge of the sync pulse, the ATE signals the LSM module that the Vmin/Fmax specification search data is ready. In step 806, the ATE and LSM log the specification search measurement and X, Y location. At the falling edge of the sync pulse, the LSM moves the continuous laser to the next location, in step 808. In step 810, when the laser stimulus signal goes "Low", laser stimulus has been stopped, and the ATE is signaled to stop logging data. In step 812 the ATE sends the Vmin/Fmax log information to the LVP system. Then in step 814 the Vmin/Fmax mapping module uses the Vmin/Fmax log information to determine the shift in electrical parameters by computing ΔVmin and ΔFmax. This information is used in step 816 to generate the contour mapping, which overlays the LSM image, as shown in FIG. 3.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of mapping an electronic device, comprising:
   loading an electronic device into a test fixture;
   stepping a laser beam across locations of interest on the electronic device;
   parking the laser beam at one location of interest at a time on the electronic device;
   computing a minimum voltage at each location of interest;
   computing a maximum frequency at each location of interest; and
   generating a contour map of changes in minimum voltage and maximum frequency across a field of view of the electronic device.

2. The method of claim 1, wherein the test fixture is an automated test fixture.

3. The method of claim 1, wherein the locations of interest on the electronic device are failing cells.

4. The method of claim 3, wherein the failing cells are determined by tests performed by the automated test equipment.

5. A method of mapping an electronic device, comprising:
   loading an electronic device into a test fixture;
   stepping a laser beam across locations of interest on the electronic device, wherein stepping a laser beam across locations of interest on the electronic device further comprises:
      signaling a laser scan module during a rising edge of a synchronization pulse that minimum voltage (Vmin) and maximum frequency (Fmax) specification search data is available;
      sending the Vmin and Fmax data from the test fixture to a laser voltage probe;
      logging the Vmin and the Fmax specification search data into a Vmin/Fmax mapping module;
      generating, by the Vmin/Fmax mapping module, a parameter shift value; and
      moving the laser beam to another position at a falling edge of the synchronization pulse;
   computing a minimum voltage at each location of interest;
   computing a maximum frequency at each location of interest; and
   generating a contour map of changes in minimum voltage and maximum frequency across a field of view of the electronic device.

6. The method of claim 5, wherein the Vmin/Fmax mapping module uses the specification data and initial Vmin and Fmax data measured with no laser stimulation to generate the parameter shift value.

7. The method of claim 5, wherein the laser beam is a continuous laser.

8. A method of mapping an electronic device, comprising:
loading an electronic device into a test fixture;
stepping a laser beam across locations of interest on the electronic device, wherein stepping a laser beam across locations of interest on the electronic device further comprises:
  logging data, by the test fixture, when a laser stimulus signal is at a high value;
  signaling, by the test fixture, the minimum voltage (Vmin) and maximum frequency (Fmax) specification search data availability, during a rising edge of a synchronization pulse;
  logging, by the test fixture and a laser scan module, the specification search data and coordinate locations;
  moving the laser to a next position when a falling edge of the synchronization pulse occurs;
  stopping logging data, by the test fixture, when the laser stimulus signal is at a low value;
  sending, by the test fixture, the Vmin and Fmax data to a laser voltage probe; and
  determining, by a Vmin/Fmax mapping module, a shift in Vmin and Fmax;
computing a minimum voltage at each location of interest;
computing a maximum frequency at each location of interest; and
generating a contour map of changes in minimum voltage and maximum frequency across a field of view of the electronic device.

9. The method of claim 8, wherein the laser beam is a continuous laser.

* * * * *